United States Patent [19]

Shrader

[11] 4,002,141

[45] Jan. 11, 1977

[54] SYSTEM FOR HANDLING SUBSTRATE HOLDERS FOR VACUUM COATING

[75] Inventor: Robert L. Shrader, Castro Valley, Calif.

[73] Assignee: Airco, Inc., Montvale, N.J.

[22] Filed: Nov. 26, 1975

[21] Appl. No.: 635,513

[52] U.S. Cl. .................................. 118/49; 118/500; 294/65.5

[51] Int. Cl.² ........................................ C23C 13/08

[58] Field of Search ............................ 118/48–49.5, 118/500–503; 294/65.5; 214/8.5; 269/8

[56] References Cited

UNITED STATES PATENTS

| | | | |
|---|---|---|---|
| 2,417,762 | 3/1947 | Koller | 294/65.5 |
| 2,623,774 | 12/1952 | Hubbard | 294/65.5 |
| 3,656,454 | 4/1972 | Shrader | 118/49 |
| 3,662,708 | 5/1972 | Shrader | 118/49 |
| 3,789,336 | 1/1974 | Gordin | 294/65.5 X |
| 3,924,759 | 12/1975 | Madonia | 294/65.5 X |

FOREIGN PATENTS OR APPLICATIONS 2,207,957  9/1972  Germany ................. 118/49.1

*Primary Examiner*—Morris Kaplan
*Attorney, Agent, or Firm*—H. Hume Mathews; Edmund W. Bopp; David A. Draegert

[57] ABSTRACT

Mechanism for lifting a substrate holder from its carrier platform and rotating the holder during substrate coating, comprises a main assembly including a permanent magnet and concentric stripping ring, an actuating piston for lowering the assembly so that the magnet and stripping ring overlie a magnetic part of the substrate holder, and for raising the assembly with coupled magnet and holder above the carrier, a spring belt transmission for rotating the magnet and holder, an auxiliary actuating piston separately connected to the magnet within the main assembly whereby upon lowering of the main assembly with holder to the carrier platform after substrate rotation, the holder can be stripped from the magnet by independent vertical actuation of the magnet piston relative to the overlying stripping ring.

17 Claims, 5 Drawing Figures

SYSTEM FOR HANDLING SUBSTRATE HOLDERS FOR VACUUM COATING

BACKGROUND OF INVENTION

Vacuum coating of substrates by the electron-beam evaporation process generally involves the practice of slowly rotating a substrate holder with respect to an offset or centrally positioned evaporation source, thereby providing for more uniform and even coating. In one example of such practice, the substrates are loaded into counter-bored holes in a holder, such as a domed disc that is placed on a carrier platform. The carrier is then transferred from atmosphere through suitable locks or chambers into the high vacuum coating zone, where it is positioned beneath a mechanism for first lifting the substrate holder from, and holding it above the carrier; the mechanism then rotates the holder with respect to a conical coating pattern or the like. Prior to substrate rotation the carrier is removed from the coating zone. After completion of coating, the carrier is returned to its prior position, the substrate holder is lowered onto it and released from the holding mechanism. The carrier with substrate holder is now free to be moved from the coating chamber for further treatment or for unloading through a lock.

A mechanism for this general purpose is disclosed by U.S. Pat. No. 3,662,708 granted May 16, 1972 to R. L. Shrader, and assigned to the same assignee as the present invention. As disclosed, an electromagnet having an energizing and de-energizing coil with conventional control circuits is provided for the pick-up, holding and release of the substrate holder. Although this system is capable of providing positive pick-up and holding force, the use of an electromagnet has certain practical disadvantages such as cost, lack of failsafe features if power is lost, and added complexity of structure, circuit controls, etc.

The present invention is therefore concerned with improvements over the mechanism described above, for providing a simpler, less expensive and more reliable substrate handling mechanism.

SUMMARY OF THE INVENTION

In accordance with the invention, a high vacuum coating chamber is provided with an upper extension housing or the like, in which the mechanism for lifting and rotating the substrate holder is mounted. This mechanism comprises essentially a main assembly that is reciprocally moveable in a vertical direction by an actuating piston and a sub-assembly that is embodied in and moveable with the main assembly. The sub-assembly comprises in a preferred form, a permanent magnet and a second or auxiliary actuating piston for independently and reciprocally moving the magnet in vertical direction with respect to the main assembly. In one form of the invention the mechanism described above for lifting and rotating the substrate holder or tray is mounted in the extension housing above the high vacuum coating source. The main assembly includes a depending frame that is connected to the main actuating piston for reciprocal movement therewith, and that terminates at its foot in a so-called "stripping ring". This ring is concentric with and encircles the permanent magnet when the main assembly is initially lowered to overlie the substrate holder for pick-up. In this position the stripping ring initially abuts on the holder to clamp it down, thereby to prevent "jumping" of the holder toward the magnet when the latter is being separately lowered for magnetic coupling therewith. When the magnet and holder are coupled, reverse actuation of the main piston lifts the entire assembly together with the substrate holder, clear of the carrier platform.

For rotating the coupled magnet and holder during the coating process, the magnet which is independently rotatable within the assembly about its vertical axis, is connected by a spring belt transmission to exterior motive means through a suitable seal in the chamber wall.

After coating of the substrates, rotation of the magnet is stopped and the main assembly piston is actuated to lower the coupled assembly frame and holder to the carrier. The seated holder is then detached from the assembly frame by the auxiliary piston of the sub-assembly which is actuated to pull the magnet upward with respect to the main assembly frame and stripping ring, the latter remaining in firm abutting engagement with the substrate holder. The holder, now stripped from the magnet, is free of the vertically spaced magnet. The main assembly frame including the stripping ring is finally raised above the holder and carrier by the main actuating piston so that the carrier with holder is cleared for exit or transfer to another chamber or lock as desired.

In an alternative form of the invention, the relative positions of the permanent magnet on the rotating mechanism and the magnetic plate (or magnet armature) on the substrate holder, can be reversed without basically changing the magnetic coupling and stripping operations as herein described.

A principal object of the invention, therefore, is an improved substrate lifting and rotating mechanism that is positive and efficient in operation, simple and comparatively inexpensive in construction and that is not dependent on an electric power source for energizing the pick-up and holding magnet.

Another object is an improved mechanism of the character described above having permanent magnet means for lifting and holding a substrate holder during coating, and mechanical means for stripping the coupled holder from the magnet means at the end of a coating operation.

Another and related object is an improved pick-up means for the substrate holder wherein the stripping means clamps the holder in place to prevent "jumping" thereof during magnetic coupling.

Another and related object is an improved releasing means for the substrate holder wherein the stripping means clamps the holder in place while magnetic uncoupling of the holder is mechanically achieved by separately operable means.

Other objects, features and advantages will appear from the following description with reference to the accompanying drawings.

DESCRIPTION OF PREFERRED EMBODIMENT

The invention is illustrated as applied to vacuum coating apparatus of the in-line multiple chamber type wherein substrate coating takes place in a high vacuum, high temperature environment for long production runs by an electron-beam evaporation or other vacuum coating process. In the evaporation type apparatus a carrier moves a holder or tray on which the substrates are positioned, into an evaporation coating chamber where the holder is lifted from the carrier and rotated during substrate coating. The carrier which has a circular cut-out corresponding generally to the substrate holder can remain in position during coating as desired.

For describing the invention, it will be sufficient to show the relevant part of the coating chamber containing the lifting and rotating mechanism for handling the substrate holder in the manner indicated above. The transfer carrier for the substrate holder can be of any suitable type, preferably such as disclosed in my copending application for "Substrate Transfer Apparatus for a Vacuum Coating System" Ser. No. 635,475, filed concurrently herewith and assigned to the assignee of the present invention.

Figure 1:
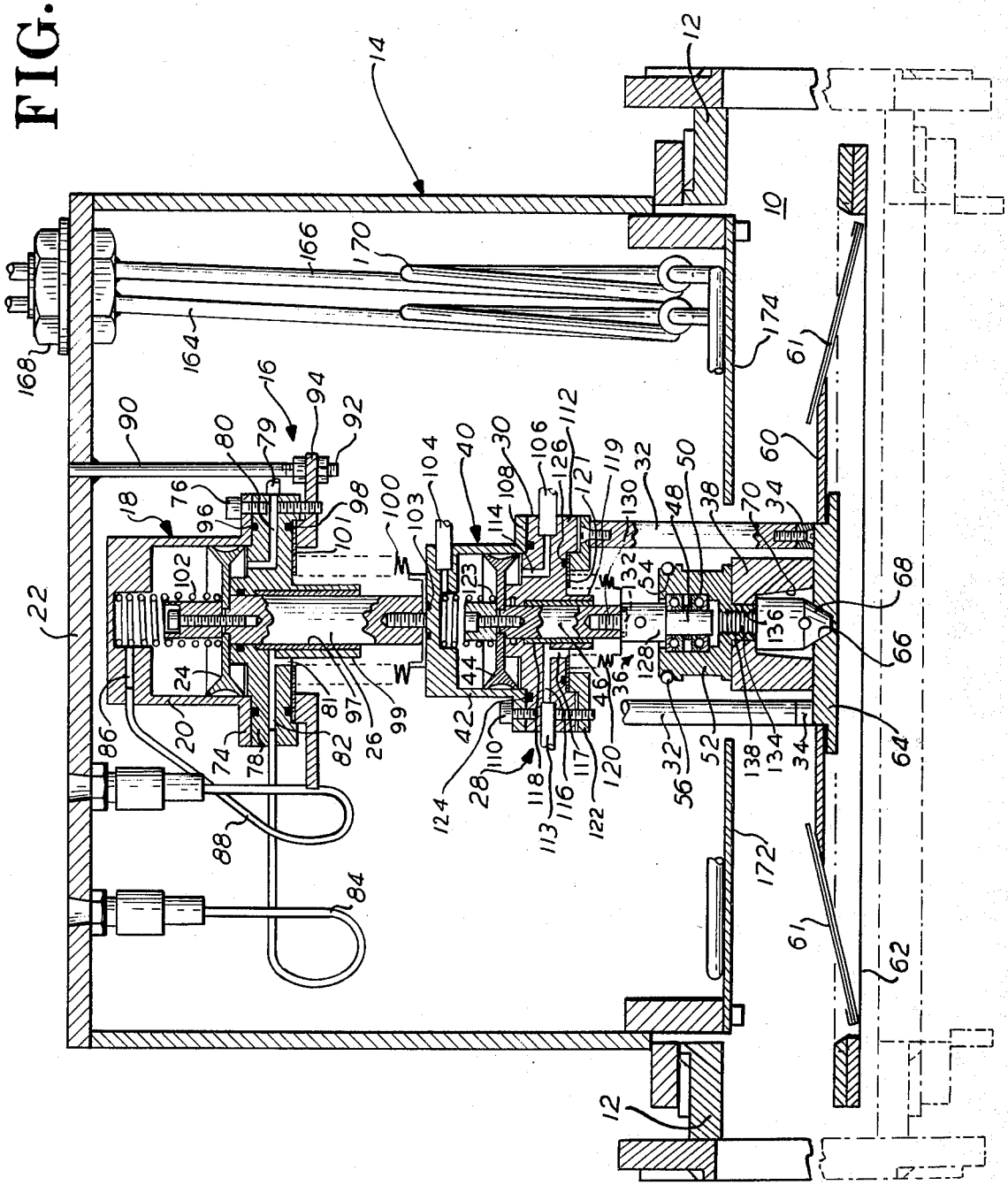
FIG. 1 is a partly sectional view in elevation showing a substrate holder lifting and rotating mechanism embodying the present invention, taken along the line 1—1 of FIG. 2.

Referring now to FIG. 1, an evaporation coating chamber indicated at 10 has an upper wall structure 12 on which an extension housing 14 is mounted. This upper housing encloses, supports and has sealed operating connections to the substrate handling mechanism 16 as described below.

In brief, the mechanism 16 comprises a main piston-cylinder actuator 18 wherein the actuator cylinder 20 is rigidly secured to the top wall 22 of the extension housing, and the piston 24 has a depending operating rod 26 that carries bodily a substrate handling assembly indicated generally at 28. The assembly 28 comprises a fabricated framework 30 (described later) that includes depending support rods 32 that have secured to the lower ends thereof a "stripping ring" 34 concentric with the central vertical axis of the assembly.

The assembly frame 30 has mounted therein a subassembly indicated at 36 comprising an auxiliary piston-cylinder actuator 40 for a permanent magnet 38. The cylinder 42 of the auxiliary actuator 40 is structurally embodied in the main assembly frame 30 and is directly connected to the main actuator rod 26. The separately actuated auxiliary piston 44 has an operating rod 46 with a shaft extension 48 that has mounted thereon a pulley 52 with roller bearings 50. The pulley is fixed to the permanent magnet. The pulley has a groove 54 for a suitable drive, such as spring belt transmission means 56, FIGS. 2 and 3, more fully described below, so that the pulley and magnet can be rotated as a free unit about the vertical axis of the sub-assembly. It will also be seen that operation of the auxiliary piston 44 is effective to move the centrally positioned magnet 38 vertically with respect to the concentric stripping ring 34 that is a part of the main assembly frame 30.

The mechanism so far generally described is adapted to handle a carrier-positioned substrate holder such as indicated at 60, FIG. 1, in the following manner: the holder 60 with substrates 61 is represented as resting on a carrier platform 62, with the substrate handling mechanism including the stripping ring 34, lowered into overlying contact therewith preparatory to lifting the holder from the carriage. To this end, the holder has formed integrally therewith a magnetic steel plate 64 having a conical centering recess 66. The permanent magnet 38 has in turn a corresponding conical centering pin 68 extending from and beyond a recess 70 in the underside of the magnet. In the coupled position shown the stripping ring 34 is pressed by the main piston 24 against the holder plate 64 and the magnet abuts the steel plate 64 so that the substrate holder is magnetically coupled to the magnet-pulley unit for pick-up.

An important function of the stripping ring in the pick-up operation is to preclude a "jump" pick-up of the holder during magnetic coupling with consequent jarring of the substrates. As the stripping ring initially clamps down the holder plate it prevents jumping of the holder toward the magnet as the latter is subsequently lowered for magnetic coupling. Also, as will be apparent, the stripping ring seats the holder firmly on the carriage and prevents jarring of the substrates during the forced release of the holder.

Figure 4:
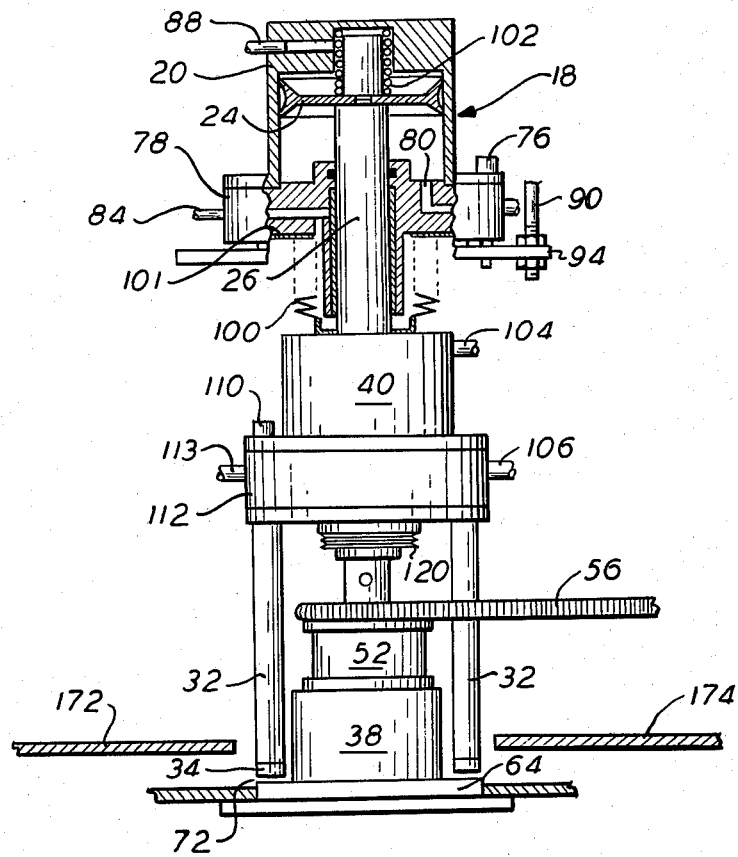
FIG. 4 is a side view, partly in section, showing the main assembly frame, magnet and substrate holder positioned for rotation of the substrate holder.
Figure 5:
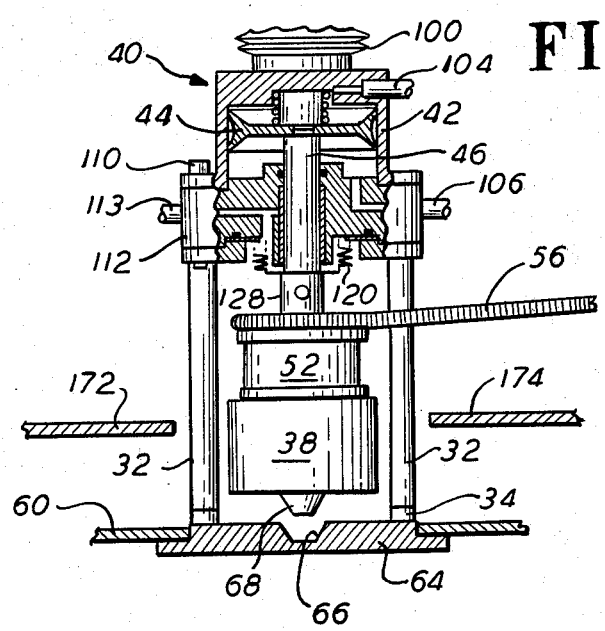
FIG. 5 is a partial view of the assembly frame with permanent magnet sub-assembly of FIG. 1, showing the magnet stripping operation.

The substrate holder, now centered on and coupled to the magnet 38, is lifted from the carrier by upward movement of the main actuating piston 24, which as described above, carries with it the entire assembly 28 including the auxiliary actuator and permanent magnet. In this elevated position represented by FIG. 4, the magnet rotating system is energized to rotate the pulley-magnet combination (52, 38) through the spring belt transmission 56, after which the coating process may be started. For avoiding interference with the stripping ring 34 during rotation of the holder 60, the magnet is positioned to extend a slight distance as indicated at 72, FIG. 4, below the ring 34 so as to clear the holder. After coating, rotation of the magnet, etc. is stopped, and the piston 24 is again actuated to lower the assembly to the position shown in FIG. 1. Release of the holder from the magnet is now required and is achieved by actuating only the auxiliary piston 44 to lift the magnet against the restraining force of the stripping ring 34 which unyieldingly abuts the steel holder-plate 64. This operation in effect forcibly strips the magnet from the substrate holder as represented by FIG. 5 so that the holder now freely seats on the carrier beyond the influence of the magnet. The assembly finally is lifted clear of the carrier by an upward stroke of the main piston 24 to provide carrier transfer clearance.

The structural components of the main and auxiliary assemblies referred to above will now be described in more detail. Referring first to the main actuator 18, the piston cylinder 20 has a lateral flange 74 to which is bolted at 76 a disc-like body 78 having fluid passages 80 and 82 connecting with lines 79 and 84 respectively, for directing fluid pressure from an exterior supply source to the underside of the piston 24, and for atmospheric venting. A passage 86 in the cylinder above the piston directs fluid pressure from a supply line 88 to cause a downstroke of the piston. As indicated, all the fluid pressure and vent lines extend in sealed relation through the upper wall 22 of the extension housing, FIGS. 1, 2 and 3.

Figure 2:
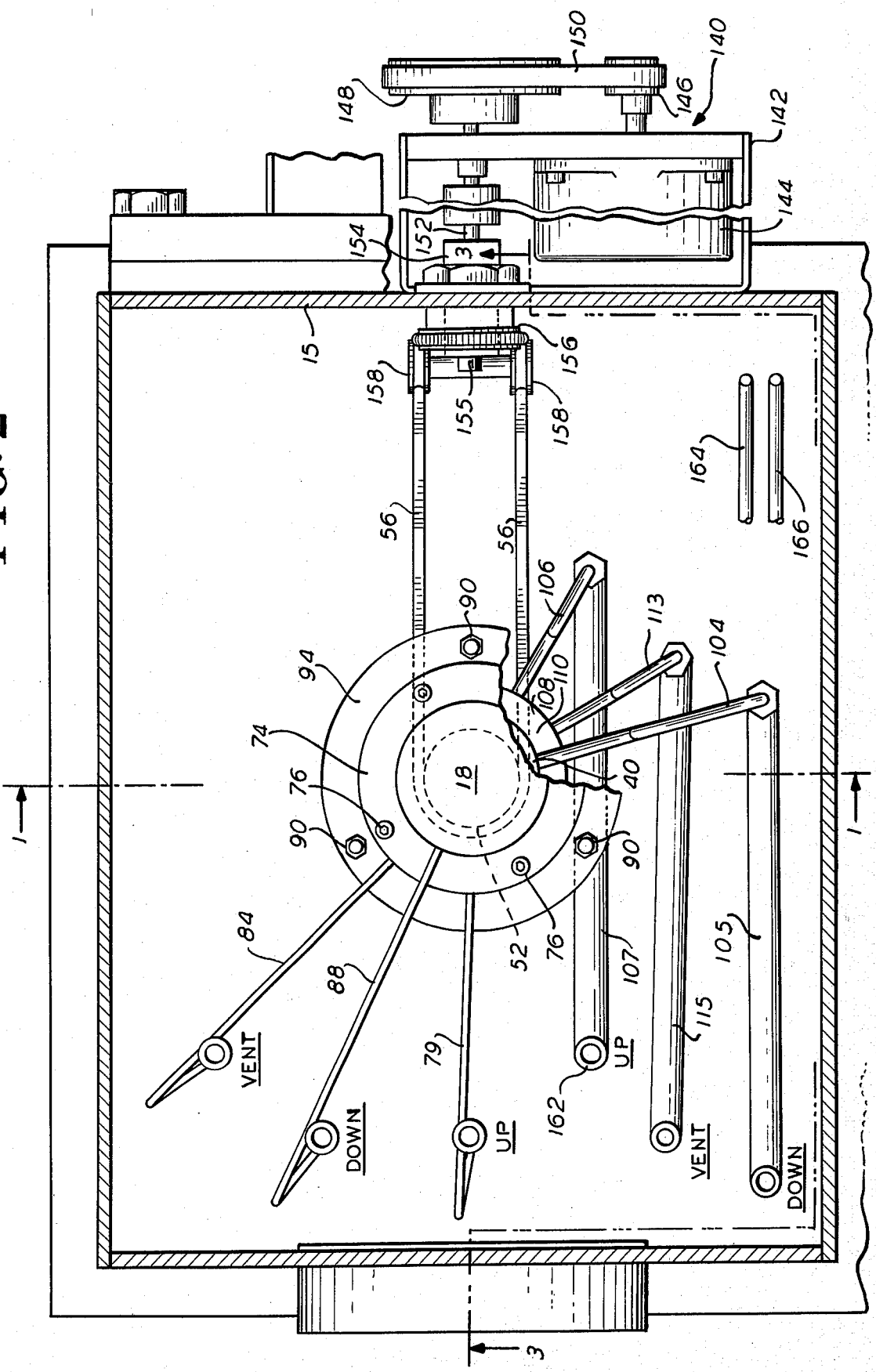
FIG. 2 is a top view, partly broken away, of mechanism shown in FIG. 1.

The main piston-cylinder actuator 18 is affixed to the housing wall 22 by suspension rods 90, FIGS. 1 and 2, that are peripherally spaced and bolted at their lower ends 92 to a ring flange 94. The fixed part of the actuator 18 is united thereto by clamping the ring-flange 94 to the underside of the disc 78 by the through-bolts 76. The O-rings 96 and 98 provide seals between the clamped surfaces of the cylinder flange 74, disc 78 and ring flange 94.

The actuating piston rod 26 extends downward through a sealing bushing 97 that is mounted within a guide sleeve 99 extending from the disc 78. For sealing the working parts of the actuator 18 with respect to the vacuum chamber, a metallic bellows 100 is connected between the disc 78 and the lower end of the piston rod 26 that carries the sub-assembly 28. The interior of the bellows is connected through passages 81 and 82 to the atmospheric vent line 84 so that upon venting, the predominant atmospheric pressure tends to expand the bellows and assist lowering of the piston rod 26. A biasing spring 102 seated above the piston serves to augment the down-stroke pressure. The upper part of the sealing bellows 100 terminates in a lateral circular flange 101 that is clamped between the disc 78 and the ring flange 94, and is sealed to the disc by the O-ring 98.

The cylinder 42 of the auxiliary actuator 40 constitutes part of the frame structure that is carried by the main actuator piston rod 26, and is connected to the fluid pressure supply lines 104 and 106 for operating the piston 44. This cylinder also has a lateral flange 108 to which is bolted at 110 a disc-like body 112 having fluid passages 114 and 116 for pressure supply and atmospheric venting respectively; as in the case of the main actuator rod 26, the auxiliary piston rod 46 extends through a sealing bushing 118 within an extension sleeve 119 of the disc 112, and has a sealing bellows 120 connected between its lower end and the disc 112. The bellows has a lateral sealing flange 121 and connects through a passage 117 with the vent passage 116 for aiding, together with a piston spring 123, expansion of the bellows and lowering of the piston 44 in the manner described above. A ring flange 122 is clamped to the disc 112 by the through-bolts 110 for supporting the stripping-ring rods 32 as described above. O-rings 124 and 126 seal the respective flanges in the manner indicated above.

The auxiliary piston rod 46 has at its lower end an extension 128 forming part of the magnet pulley shaft 48. This extension is joined to the piston rod by a threaded stud 130 so as to make a seal (O-ring 132) with the bellows 120. For securing the magnet to the pulley, a threaded stud 134 on the magnet centering pin 68 extends through a center bore 136 in the magnet to engage a depending threaded sleeve 138 of the pulley to clamp the magnet and pulley together. Thus, the spring belt 56 can freely rotate the pulley-magnet unit on the pulley shaft bearings 50 independently of the actuator lifting mechanisms.

Figure 3:
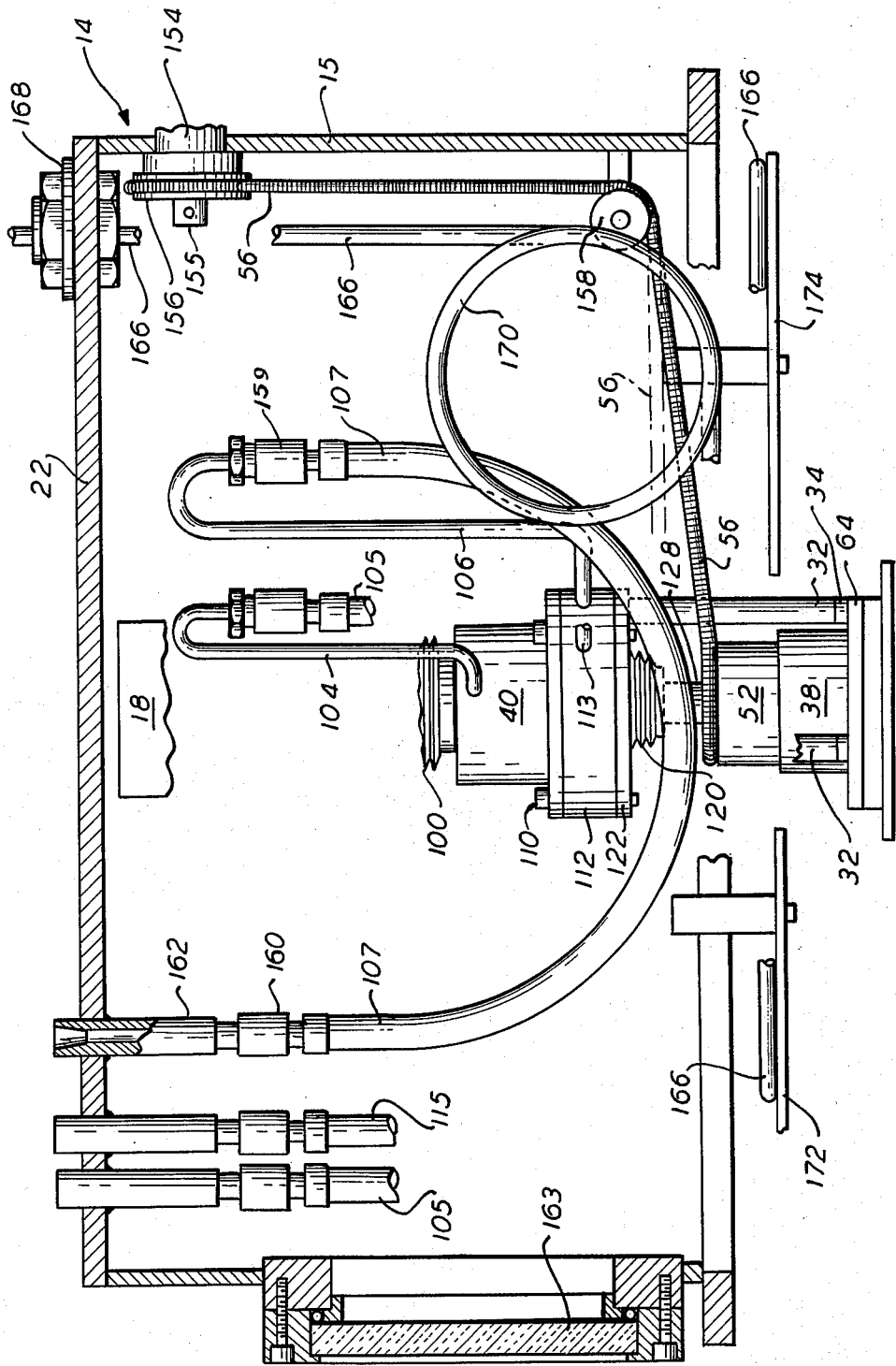
FIG. 3 is a side view, partly broken away, of mechanism shown in FIG. 1, taken generally along line 3—3 thereof.

The belt drive transmission for rotating the magnet comprises, as shown in FIGS. 2 and 3, exterior motive means 140 mounted as an assembly on a side wall 15 of the extension housing. The assembly comprises a mounting frame 142 for supporting an electric drive motor 144 and transmission, including a motor shaft pulley 146 and drive pulley 148 interconnected by a belt 150. The drive pulley is connected to a transmission shaft 152 that has a suitable rotary shaft vacuum seal 154 in the housing wall 15. The output shaft 155 of the seal, FIG. 3, which may be of the "ferro-fluidic" type for example, extends within the housing for connection to a coupling pulley 156, FIGS. 2 and 3. This pulley in turn drives the magnet pulley 52 through the closed-loop spring belt 56 that extends first downward from the pulley 156 to idler guide pulleys 158, and then laterally to the magnet pulley, FIG. 2. When the magnet pulley is in normal position for rotation, the spring belt is connected thereto along a practically horizontal line as indicated in dotted lines, FIG. 3, and as shown in the rotation position, FIG. 4.

The fluid (air) pressure and atmospheric venting lines where required, provide for relative movement between the assembly and seal-through connections in the housing wall as indicated in FIGS. 2 and 3. As the main actuator 18 is rigidly mounted on the top wall 22, FIG. 1, the vent line 84 and the fluid pressure lines 79 and 88 respectively, comprise tubing that can be permanently connected to the actuator as indicated; however, the sub-assembly magnet actuator 40 which is movable relative to the housing requires lines with flexibility and slack, such as shown in FIG. 3 for example, wherein the "UP" line may comprise a tubing connection 106 with the actuator 40, coupled at 159 with a flexible hose 107. This hose in turn has a coupling 160 with a seal-through connection 162 in the upper wall 22 to an exterior fluid pressure source. The "DOWN" and "VENT" actuator tubes 104 and 113 are similarly connected to flexible hosing 105 and 115, respectively.

The tube lines 79, 84 and 88 for the fixed actuator 18 have similar seal-through connections in the housing top wall as indicated in FIG. 2. The lines for the respective actuators can be controlled as required by conventional three-way solenoid valves.

Auxiliary features include a view-port 163, FIG. 3, and cooling pipes for dissipating excessive heat developed by the evaporation process. The pipes with circulating cooling water are led through a sealed wall connection 168 and disposed in the extension housing as indicated at 164 and 166, FIGS. 1 and 3. The pipes are formed with expansion loops 170 that also facilitate connecting of the pipes. Heat shield plates 172 and 174 of copper or like, are also located across sections of the lower end of the extension housing and are cooled by the pipes which are brazed thereto in overlying heat conducting relation as shown.

As previously indicated, the permanent magnet arrangement for picking up the holder, etc., can be reversed, i.e. the permanent magnet can be mounted on the holder and the magnet armature (steel plate) can be carried by the auxiliary piston rod 46. In such case, the stripping ring could be of non-magnetic material or bear on a non-magnetic part of the holder.

Having set forth the invention in what is considered to be the best embodiment thereof, it will be understood that changes may be made in the system and apparatus as above set forth without departing from the spirit of the invention or exceeding the scope thereof as defined in the following claims.

I claim:
1. In a vacuum coating system wherein a substrate holder is positioned within a vacuum chamber for substrate coating, means for handling the holder for the coating process comprising:
   a. a main actuator mounted on a fixed wall portion of the vacuum chamber and having an actuating member guided for reciprocal movement;
   b. an assembly movable with and carried by the actuating member having a frame portion arranged to abut the substrate holder;

c. the assembly including an auxiliary actuator having an operating member that is reciprocally movable with respect to the frame portion;
d. coacting magnet elements including a permanent magnet and an armature therefor, one of which is mounted on the substrate holder and the other is connected to the operating member of the auxiliary actuator for making a magnetic coupling between the holder and auxiliary actuator;
e. means for operating the main actuator to move the assembly with the coupled magnet elements and holder to a position for substrate coating and to return the assembly and holder to the initial position thereof wherein the frame portion abuts the holder; and
f. means for separately operating the auxiliary actuator to move the corresponding magnet element with respect to the abutting frame portion and holder for uncoupling the magnet elements and thereby releasing the holder.

2. Substrate handling means as specified in claim 1, wherein the main actuator comprises a cylinder that is mounted on a fixed wall of the chamber, and an operating piston that carries the assembly.

3. Substrate means as specified in claim 1, wherein the auxiliary actuator comprises a cylinder fixed with respect to the assembly frame and an operating piston, and one of the magnet elements is connected to the auxiliary operating piston.

4. Substrate handling means as specified in claim 1, wherein the assembly frame portion is arranged to be biased by the main actuator into abutting engagement with the substrate holder.

5. Substrate handling means as specified in claim 4, wherein the frame portion for abutting the substrate holder is a ring arranged to make substantially planar contact with the holder.

6. Substrate handling means as specified in claim 3, wherein the magnet element connected to the auxiliary piston is mounted for free rotation about the longitudinal axis thereof.

7. Substrate handling means as specified in claim 6 wherein a pulley is rotatably mounted on the auxiliary piston, and the magnet element is fixed to the pulley for rotation therewith.

8. Substrate handling means as specified in claim 6, wherein the coupled auxiliary actuator and substrate holder in the substrate coating position of the assembly are connected to motive means for rotating the holder.

9. Substrate handling means as specified in claim 8, wherein the motive means is disposed exteriorily of the chamber and has a rotatable operating shaft extending through a vacuum seal in the chamber wall, and a spring belt transmission interconnects the shaft extension within the chamber to the coupled auxiliary actuator and holder.

10. Substrate handling means as specified in claim 1, wherein the magnet element connected to the auxiliary actuator is a permanent magnet and the magnet element mounted on the substrate holder is the magnet armature.

11. Substrate handling means as specified in claim 10, wherein the permanent magnet has a depending centering pin for engaging a corresponding recess in the armature on the holder for initially aligning the magnet and holder.

12. Substrate handling means as specified in claim 5, wherein the frame portion includes peripherally spaced rods depending from the main actuating member for supporting the ring.

13. Substrate handling means as specified in claim 2, wherein the main actuator cylinder has secured thereto structure defining an end-wall thereof and a plurality of rods depending from the vacuum chamber wall hold said structure in position to support the main actuator.

14. Substrate handling means as specified in claim 3, wherein the assembly frame includes structure forming an end-wall of the auxiliary actuator cylinder, and the frame portion arranged to abut the substrate holder is secured to said end-wall structure.

15. Substrate handling means as specified in claim 3, wherein an end-wall of the auxiliary actuator cylinder has a vent passage to atmosphere, and a vacuum sealing bellows interconnecting the end wall and the auxiliary piston rod communicates with the vent passage.

16. Substrate handling means as specified in claim 1, wherein the main and auxiliary actuators are of the cylinder-piston type and are connected respectively to operating fluid passages, and the piston rod extending from the cylinder of each actuator is vacuum sealed by a bellows that interconnects the rod and the adjacent cylinder wall, and the cylinder wall has a vent line to atmosphere communicating with the interior of the respective bellows for applying expanding force to the bellows.

17. In vacuum coating apparatus, mechanism disposed within a vacuum chamber for vertically moving and rotating a substrate holder, comprising:
a. a main actuator mounted in the chamber and having a first vertically moveable operating member;
b. an auxiliary actuator connected to and bodily moveable with the first operating member and having a second vertically moveable operating member;
c. coacting magnet elements including a permanent magnet and an armature therefor;
d. one magnet element being connected to and bodily moveable with the second operating member and the other element being mounted on the holder to make magnetic coupling between the holder and auxiliary actuator whereby the holder can be bodily elevated by the main actuator for substrate coating;
e. means for independently rotating the elevated coupled magnet elements and holder as a unit, and
f. means fixed with respect to the main operating member and overlying and abutting the holder in its lowered position whereby elevation of the respective magnet element by the second operating member causes separation of the magnet elements to uncouple the holder.

* * * * *